United States Patent
Lee et al.

(10) Patent No.: US 10,854,644 B2
(45) Date of Patent: Dec. 1, 2020

(54) DISPLAY APPARATUS INCLUDING THIN FILM TRANSISTOR AND METHOD OF MANUFACTURING THE SAME

(71) Applicant: Samsung Display Co., Ltd., Yongin-si (KR)

(72) Inventors: Jongchan Lee, Yongin-si (KR); Jaeseob Lee, Yongin-si (KR); Woonghee Jeong, Yongin-si (KR); Taehoon Yang, Yongin-si (KR); Yongsu Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 4 days.

(21) Appl. No.: 16/106,161

(22) Filed: Aug. 21, 2018

(65) Prior Publication Data
US 2019/0074304 A1    Mar. 7, 2019

(30) Foreign Application Priority Data
Sep. 6, 2017    (KR) .................. 10-2017-0113948

(51) Int. Cl.
*H01L 27/12* (2006.01)
*H01L 29/786* (2006.01)
(Continued)

(52) U.S. Cl.
CPC ........ *H01L 27/1255* (2013.01); *H01L 21/266* (2013.01); *H01L 27/1251* (2013.01);
(Continued)

(58) Field of Classification Search
None
See application file for complete search history.

(56) References Cited

U.S. PATENT DOCUMENTS 5,814,834 A * 9/1998 Yamazaki ............. H01L 27/12
257/347
9,343,548 B1    5/2016 Sang et al.
(Continued)

FOREIGN PATENT DOCUMENTS

KR    1020160065398 A    6/2016
KR    1020160082189 A    7/2016
(Continued)

*Primary Examiner* — Nicholas J Tobergte
*Assistant Examiner* — Kien C Ly
(74) *Attorney, Agent, or Firm* — Cantor Colburn LLP

(57) ABSTRACT

A display apparatus includes: at thin film transistor on a substrate; and a capacitor on the substrate, the capacitor including a first storage electrode and a second storage electrode. The thin film transistor includes: a semiconductor layer on the substrate, including: a channel region in which are disposed: bridged grain lines defined by portions of the semiconductor layer having an amount of a dopant, and semiconductor lines defined by portions of the semiconductor layer having a dopant amount less than that of the bridged grain lines and forming an interface with the bridged grain lines, and source and drain regions disposed at opposing sides of the channel region; and a gate electrode overlapping the semiconductor layer with a gate insulation film therebetween, the gate electrode including: first gate electrodes corresponding to the semiconductor lines, respectively, and a second gate electrode covering the gate electrodes.

12 Claims, 12 Drawing Sheets

(51) Int. Cl.
    *H01L 29/66*        (2006.01)
    *H01L 21/266*      (2006.01)
    *H01L 27/32*        (2006.01)

(52) U.S. Cl.
    CPC ...... *H01L 27/1259* (2013.01); *H01L 27/1285* (2013.01); *H01L 27/1288* (2013.01); *H01L 29/66484* (2013.01); *H01L 29/66757* (2013.01); *H01L 29/78645* (2013.01); *H01L 29/78648* (2013.01); *H01L 29/78696* (2013.01); *H01L 27/3262* (2013.01); *H01L 27/3265* (2013.01)

(56) References Cited

U.S. PATENT DOCUMENTS

| | | | |
|---|---|---|---|
| 9,704,934 B2 | 7/2017 | Park | |
| 2016/0372498 A1 | 12/2016 | Ahn et al. | |
| 2017/0018652 A1* | 1/2017 | Liu | H01L 27/02 |

FOREIGN PATENT DOCUMENTS

| | | |
|---|---|---|
| KR | 1020160120852 A | 10/2016 |
| KR | 1020170000064 A | 1/2017 |

* cited by examiner

DISPLAY APPARATUS INCLUDING THIN FILM TRANSISTOR AND METHOD OF MANUFACTURING THE SAME

This application claims priority to Korean Patent Application No. 10-2017-0113948, filed on Sep. 6, 2017, and all the benefits accruing therefrom under 35 U.S.C. § 119, the content of which is incorporated herein in its entirety by reference.

BACKGROUND

1. Field

One or more embodiments relate to a display apparatus including a thin film transistor and a method of manufacturing the display apparatus.

2. Description of the Related Art

A thin film transistor ("TFT") is a transistor including an insulating support substrate and a semiconductor thin film formed on the insulating support substrate, and has three terminals of a gate terminal, a drain terminal and a source terminal. A voltage applied to the gate terminal is adjusted to turn on or turn off an electrical current flowing between the source terminal and the drain terminal, to perform a switching operation of the transistor.

The thin film transistor is used in various technology fields such as a sensor, a memory element, an optical element and a pixel switching element or driving element of a display apparatus. A display apparatus is an apparatus for visually displaying data using light, and includes a pixel including the thin film transistor. With the demand for higher performance and higher resolution of a display apparatus, higher performance of a thin film transistor is also required.

SUMMARY

One or more embodiments include a display apparatus including a thin film transistor, which can reduce process steps and process time in manufacturing the display apparatus while having excellent performance, and a method of manufacturing the display apparatus.

Additional features will be set forth in part in the description which follows and, in part, will be apparent from the description, or may be learned by practice of the presented embodiments.

According to one or more embodiments, a display apparatus includes a thin film transistor on a substrate; and a capacitor on the substrate, the capacitor including a first storage electrode and a second storage electrode. The first thin film transistor includes: a semiconductor layer disposed on the substrate, including: a channel region in which are disposed: a plurality of bridged grain ("BG") lines defined by portions of the semiconductor layer having an amount of a dopant, and a plurality of semiconductor lines defined by portions of the semiconductor having a dopant amount less than that of the bridged grain lines and forming an interface with the bridged grain lines, and source and drain regions respectively disposed at opposing sides of the channel region; and a gate electrode disposed to overlap the semiconductor layer with a first gate insulation film therebetween, the gate electrode including: a plurality of first gate electrodes disposed corresponding to the plurality of semiconductor lines, respectively, and a second gate electrode covering the plurality of first gate electrodes.

The plurality of the first gate electrodes may be disposed in a same layer as that the first storage electrode and formed from a same material layer as the first storage electrode, and the second gate electrode may be formed from a same material layer as the second storage electrode.

The plurality of BG lines may be lengthwise extended to intersect a virtual line extending between the source region and the drain region.

The plurality of semiconductor lines may be portions of the semiconductor layer which are not doped, or are portions of the semiconductor layer doped with a dopant different from that of the plurality of BG lines.

The display apparatus may further include a switching thin film transistor including a switching semiconductor layer and a switching gate electrode. The switching semiconductor layer is disposed in a different layer from that of the semiconductor layer.

The thin film transistor may further include a second gate insulation film covering the first storage electrode, and the second gate insulation film may include an opening corresponding to the channel region, source region and drain region of the semiconductor layer.

According to one or more embodiments, a method of manufacturing a display apparatus includes forming a semiconductor layer of a first thin film transistor, on a substrate; forming a plurality of first gate electrodes of the first thin film transistor, overlapping the semiconductor layer thereof; forming a first gate insulation film between the semiconductor layer and the plurality of first gate electrodes; performing a first doping process in which a dopant is applied to the semiconductor layer of the first thin film transistor using the plurality of the first gate electrodes thereof as a doping mask; and forming a second gate electrode covering the plurality of first gate electrodes. The first doping process forms within the semiconductor layer of the first thin film transistor: a plurality of bridged grain lines doped with an amount of the dopant, and a semiconductor line between the plurality of bridged grain lines, the semiconductor line having an amount of dopant less than that of the plurality of bridged grain lines.

The display apparatus may further include a capacitor including a first storage electrode and a second storage electrode, and the first storage electrode may be formed from a same material layer and in a same process as the plurality of first gate electrodes, and the second storage electrode may be formed from a same material layer as the second gate electrode.

The method may further include performing a second doping process in which a dopant is applied to the semiconductor layer including the plurality of bridged grain lines and the semiconductor line, to form a source region and a drain region in the semiconductor layer of the first thin film transistor, using the second gate electrodes as a doping mask.

The plurality of BG lines may be formed lengthwise extended to intersect a virtual line extending between the source region and the drain region.

The dopant applied in the first doping process and the dopant applied in the second doping process may be the same as each other.

The method may further include forming a first planarization film having a flat upper surface to cover the second gate electrode; forming a second gate insulation film on the first planarization layer; forming a switching semiconductor layer of a switching thin film transistor, between the first planarization film and the second gate insulation film; forming a switching gate electrode of the switching thin film transistor to overlap the switching semiconductor layer thereof; and performing a third doping process in which a dopant is applied to the switching semiconductor layer, to form a source region and a drain region in the switching semiconductor layer of the switching thin film transistor, using the switching gate electrode as a doping mask.

The dopant applied in the second doping process and the dopant applied in the third doping process may be different from each other.

The method may further include forming a second planarization film having a flat upper surface to cover the switching gate electrode; and forming a display device on the second planarization film.

According to one or more embodiments, a display apparatus includes a substrate including a pixel at which light is emitted to display an image; a bottom gate type thin film transistor disposed in the pixel, including: a first semiconductor layer including a channel region in which are disposed a plurality of bridged grain lines defined by portions of the first semiconductor layer having an amount of a dopant, and a first gate electrode disposed between the substrate and the first semiconductor layer; a top gate type second thin film transistor in the pixel in which the bottom gate type thin film transistor is disposed, including: a second semiconductor layer disposed in a different layer from that of the first semiconductor layer of the bottom gate type thin film transistor, and a second gate electrode disposed on the second semiconductor layer to overlap the second semiconductor layer; and a semiconductor mask layer disposed to overlap the channel region of the first semiconductor layer of the bottom gate type thin film transistor, the semiconductor mask layer disposed in a same layer as that of the second semiconductor layer of the top gate type thin film transistor.

The semiconductor mask layer may include a plurality of protrusions.

The gap between the plurality of protrusions may be about 0.2 micrometer ($\mu$m) to about 0.3 $\mu$m.

The first semiconductor layer may include source and drain regions disposed at opposing sides of the channel region, and the plurality of BG lines may be lengthwise extended to intersect a virtual line extended between the source region and the drain region.

The channel region of the first semiconductor layer may include a semiconductor line disposed between the plurality of BG lines, the semiconductor line defined by a portion of the first semiconductor layer having a dopant amount less than that of the bridged grain lines and forming an interface with the bridged grain lines, and the semiconductor line may be a portion of the first semiconductor layer which is not doped, or may be a portion of the first semiconductor layer doped with a dopant different from that of the plurality of BG lines.

The display apparatus may further include a first planarization film disposed between the first semiconductor layer and the second semiconductor layer; a second planarization film disposed to cover the second gate electrode; and a display device disposed on the second planarization film.

BRIEF DESCRIPTION OF THE DRAWINGS

These and/or other features will become apparent and more readily appreciated from the following description of the embodiments, taken in conjunction with the accompanying drawings in which:

FIGS. 3 to 6A, 7 and 8 are cross-sectional views schematically illustrating a structure of a display apparatus in an exemplary embodiment of a method of manufacturing the display apparatus, according to the invention.

DETAILED DESCRIPTION

Figure 1:
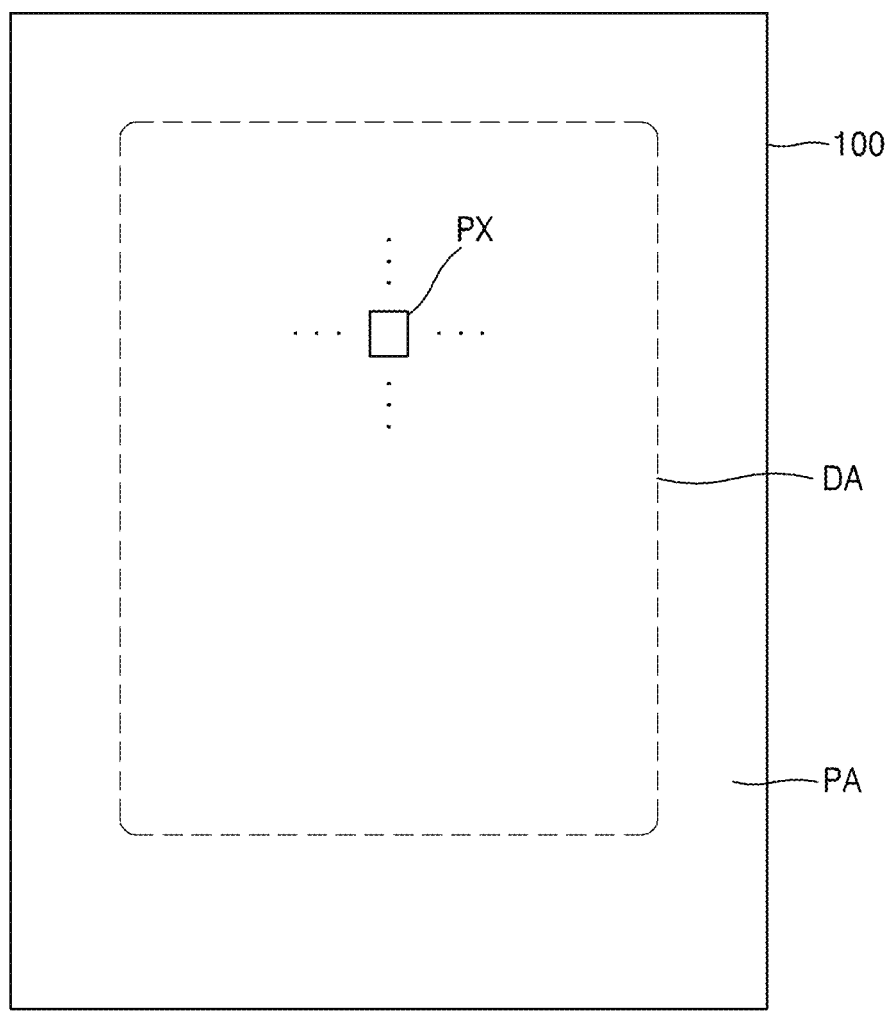
FIG. 1 is a top plan view schematically illustrating an exemplary embodiment of a portion of a display apparatus according to the invention.

Reference will now be made in detail to exemplary embodiments, examples of which are illustrated in the accompanying drawings, where like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain features of the present description.

Hereinafter, the invention will be described in detail by explaining exemplary embodiments of the invention with reference to the attached drawings. Like reference numerals in the drawings denote like elements, and thus their description will be omitted.

It will be understood that, although the terms first, second, etc. may be used herein to describe various elements, these elements should not be limited by these terms. These terms are only used to distinguish one element from another.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of components in the drawings may be exaggerated for convenience of explanation. In other words, since sizes and thicknesses of components in the drawings are arbitrarily illustrated for convenience of explanation, the following embodiments are not limited thereto. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display apparatus is an apparatus for displaying an image, and examples thereof may include a liquid crystal display, an electrophoretic display, an organic light emitting display, an inorganic light emitting display, a field emission display, a surface-conduction electron-emitter display, a plasma display, a cathode ray display, or the like.

Hereinafter, as a display apparatus according to an embodiment, an organic light emitting display apparatus will be described as an example, but the display apparatus is not limited thereto, and various types of display apparatuses may be used.

FIG. 1 is a top plan view schematically illustrating an exemplary embodiment of a portion of a display apparatus according to the invention. The display apparatus and components thereof may be disposed in a plane defined by a first (x) direction and a second (y) direction which cross each other. A thickness or height of the display apparatus and components thereof may be defined in a third (z) direction crossing each of the first and second directions.

Referring to FIG. 1, a display apparatus according to the present embodiment includes a (base) substrate 100. The substrate 100 is disposed in a plane defined by the x and y directions. As shown in FIG. 1, the substrate 100 included in the display apparatus according to the present embodiment includes a display area DA and a peripheral area PA which is located outside the display area DA. Light may be generated or transmitted, and an image may be displayed, at the display area DA. Light may not be generated or transmitted, and an image may not be displayed, at the peripheral area PA. The display area DA of the substrate 100 may be provided with a pixel PX provided in plurality, and each of the plurality of pixels PX may be provided with various display devices which generate light and/or display an image with light. The display devices may include an organic light-emitting device ("OLED"). Various conductive wirings for transmitting an electrical signal to be applied to the display area DA may be disposed in the peripheral area PA of the substrate 100. The wirings may be connected to elements in the display area DA, such as components of the pixels and/or the display devices.

Figure 2:
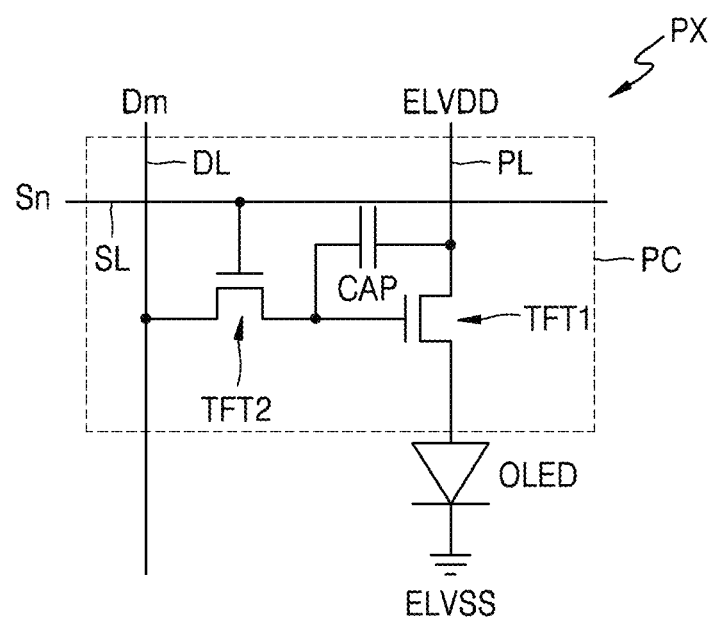
FIG. 2 is an equivalent circuit diagram of an exemplary embodiment of one pixel included in the display apparatus of FIG. 1.

FIG. 2 is an equivalent circuit diagram of an exemplary embodiment of one pixel included in the display apparatus 1 of FIG. 1. FIG. 2 shows a case where a pixel includes an organic light-emitting device.

Referring to FIG. 2, each pixel PX may include a pixel circuit PC connected to a scan line SL and a data line DL, and an organic light-emitting device OLED connected to the pixel circuit PC. Each of these elements may be disposed on the substrate 100, without being limited thereto.

The pixel circuit PC includes a driving thin film transistor TFT1, a switching thin film transistor TFT2 and a capacitor CAP. The switching thin film transistor TFT2 is connected to the scan line SL and the data line DL, and allow transmission of a data signal Dm through the data line DL to the driving thin film transistor TFT1 DL in accordance with a scan signal Sn input through the scan line SL.

The capacitor CAP is connected to the switching thin film transistor TFT2 and a driving voltage line PL. The capacitor CAP stores a voltage corresponding to a difference between a voltage received from the switching thin film transistor TFT2 and a driving voltage ELVDD supplied to and transmitted through the driving voltage line PL.

The driving thin film transistor TFT1 is connected to the driving voltage line PL and the capacitor CAP, and may control a driving electrical current flowing from the driving voltage line PL to the organic light-emitting device OLED in response to the voltage value stored in the capacitor CAP. The organic light-emitting device OLED may generate and emit light having predetermined luminance by the electrical driving current applied thereto.

The equivalent circuit diagram of the pixel PX disclosed in FIG. 2 is only an example, and the equivalent circuit diagram of the pixel PX included in the display apparatus may be may be variously provided. In an exemplary embodiment, for example, one pixel may include three to seven thin film transistors and/or may include a plurality of capacitors.

A display apparatus according to one or more embodiments includes a thin film transistor having a bridged grain ("BG") (electrically conductive) line in a channel region of the thin film transistor. The BG lines may be provided in plurality in the channel region. Each of the BG lines is an electrically conductive line doped in a relatively high concentration to have conductivity. A length of each of the BG lines may be extended perpendicular to the direction of the electrical current flowing in the channel region. Such BG lines can reduce an effect due to a grain structure arbitrarily formed in the channel region of the thin film transistor during manufacturing of a display apparatus, thereby reducing leakage of electrical current of the thin film transistor and reducing or effectively preventing a hot (electrical charge) carrier phenomenon.

Hereinafter, a structure of a display apparatus in an exemplary embodiment of a manufacturing method and structure of the display apparatus 10 according to the invention will be described with reference to FIGS. 3 to 8. The views of FIGS. 3 to 8 are representative of a structure in a pixel PX in the display area DA (refer to FIG. 1) of a display apparatus, without being limited thereto. A thickness of layers of the display apparatus in FIGS. 3 to 6A, 7 and 8 is defined in the vertical direction of the views, e.g., the third (z) direction. FIG. 6B is a view from the top of a plane defined in the first (x) and second (y) directions.

Figure 3:
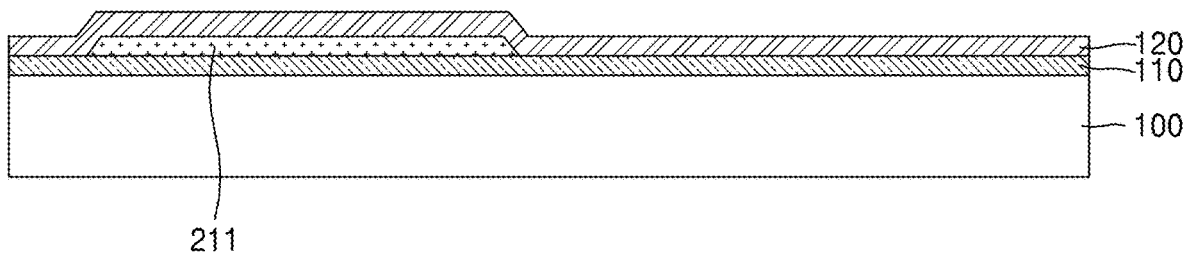

Referring to FIG. 3, a buffer film 110, a driving semiconductor layer 211 and a first gate insulation film 120 are sequentially formed on a (base) substrate 100.

The substrate 100 may include or be made of various materials such as glass, metal and plastic. According to an embodiment, the substrate 100 may be a substrate 100 including or made of a flexible material. Here, the substrate 100 including a flexible material refers to a substrate that is relatively easily deformed, bent, and folded or rolled. This substrate 100 which is flexible may include various materials having flexible or bendable properties. Examples of the materials of the substrate 100 having flexible or bendable properties may include polymer resins such as polyethersulphone ("PES"), polyacrylate ("PAR"), polyetherimide ("PEI"), polyethyelenene napthalate ("PEN"), polyethyelene terepthalate ("PET"), polyphenylene sulfide ("PPS"), polyallylate, polyimide ("PI"), polycarbonate ("PC"), and cellulose acetate propionate.

The buffer film 110 may be disposed on the substrate 100 to reduce or effectively prevent the penetration of foreign matter, moisture or external air from the lower portion of the substrate 100 to layers thereon, and provide a relatively flat surface on the substrate 100 on which the layers may be formed. The buffer film 110 may include an inorganic material such as an oxide or a nitride, an organic material, or an inorganic-organic composite material, and may have a single layer or multilayer structure of an inorganic material and an organic material. The buffer film 110 may be omitted in some cases.

The buffer film 110 may be formed through various deposition processes. In an exemplary embodiment, for example, the buffer film 110 may be formed by chemical vapor deposition ("CVD") or atomic layer deposition ("ALD").

The driving semiconductor layer 211 may include or be formed of polysilicon material obtained by crystallizing amorphous silicon. The crystallization of the amorphous silicon may be performed by laser annealing or furnace annealing using excimer laser or yttrium aluminum garnet ("YAG") laser.

In an exemplary embodiment, a photoresist pattern is formed on a portion of the polysilicon material at which the driving semiconductor layer 211 is to be formed. The unpatterned polysilicon material is etched by wet etching, dry etching or a comb thereof, by using the photoresist pattern, so as to form the driving semiconductor layer 211. The driving semiconductor layer 211 of FIG. 3 is un-doped.

A first gate insulation film 120 covering the driving semiconductor layer 211 is formed. The first gate insulation layer 120 may include an inorganic material such as silicon oxide, silicon nitride, and/or silicon oxynitride. The first gate insulation layer 120 may be formed by chemical vapor deposition ("CVD") or atomic layer deposition ("ALD").

Figure 4:
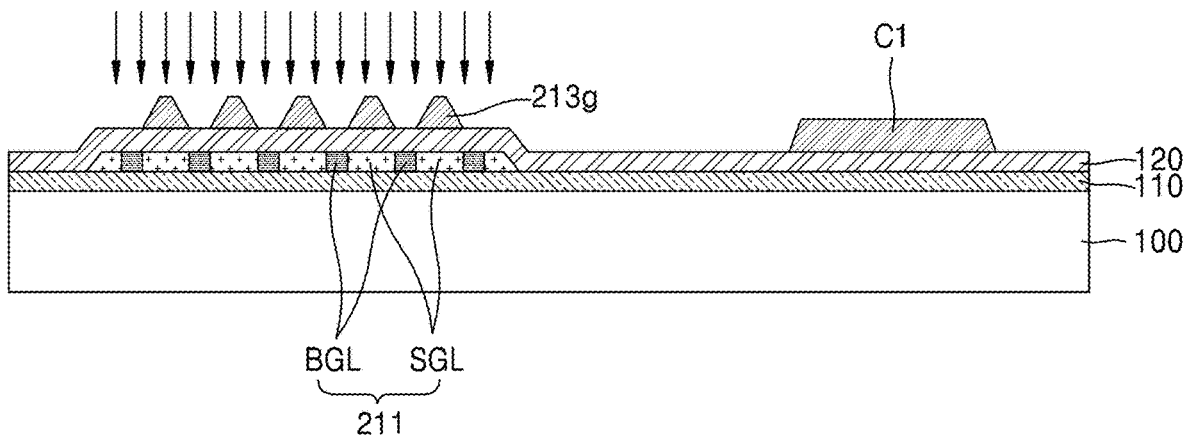

Referring to FIG. 4, in order to form a BG line BGL in plurality within the driving semiconductor layer 211, a dopant is injected (downward arrows in FIG. 4) into the un-doped driving semiconductor layer 211 using first gate electrode 213g as a doping mask.

The first gate electrode 213g and a first storage electrode C1 of a capacitor are each formed on the first gate insulation layer 120 so as to overlap the driving semiconductor layer 211. Each of the gate electrode 213g and the first storage electrode C1 may be provided in plurality on the first gate insulation layer 120.

In order to form the first gate electrodes 213g and the first storage electrode C1, a gate electrode material layer (not shown) is formed over the entire surface of the substrate 100 including the gate insulation layer 120 thereon. The gate electrode material layer may be formed by a deposition method such as chemical vapor deposition ("CVD"), plasma enhanced CVD ("PECVD"), low pressure CVD ("LPCVD"), physical vapor deposition ("PVD"), sputtering, or atomic layer deposition ("ALD").

A photoresist pattern is formed on the gate electrode material layer, and the gate electrode material layer is etched by using the photoresist pattern, thereby forming the first gate electrodes 213g and the first storage electrode C1 from the same gate electrode material layer to be disposed in a same layer among layers formed on the substrate 100. As being in a same layer, elements may be formed from a same material layer on the substrate 100 to thereby be formed in a same layer among layers disposed on the substrate 100.

The first gate electrodes 213g and the first storage electrode C1 may include molybdenum (Mo), aluminum (Al), copper (Cu), and/or titanium (Ti), and may be formed as a single layer film or a multilayer film. In some embodiments, the first gate electrodes 213g and the first storage electrode C1 may be formed of a double layer film of Ti/Cu or Ti/Al. In this case, the Ti layer is disposed at the lower portion of the double layer film, is formed to have a smaller thickness than that of the Cu layer or the Al layer, and thus functions as a barrier.

A first doping process is performed to form the BG lines by injecting (downward arrows in FIG. 4) a dopant into the undoped driving semiconductor layer 211 using the first gate electrodes 213g as a doping mask.

The dopant may be an n-type or p-type dopant. The n-type dopant may be phosphorus (P), arsenic (As), antimony (Sb), bismuth (Bi), or the like. The p-type dopant may be boron (B), aluminum (Al), indium (In), gallium (Ga), or the like.

The first doping process is a process of forming the BG lines within the driving semiconductor layer 211. In the first doping process, a relatively high-concentration dopant may be injected to portions of the driving semiconductor layer 211 such that the BG lines having conductivity are formed by such doped portions. In an exemplary embodiment, for example, in the first doping process, a dopant having a concentration of about 1E12 to 1E13 ions/cm$^3$ ($1\times10^{12}$ to $1\times10^{13}$ ions/cm$^3$) may be injected to the portions of the driving semiconductor layer 211 to form the BG lines BGL.

By the formation of the plurality of BG lines BGL within the driving semiconductor layer 211, a semiconductor line SGL disposed between the BG lines BGL may be formed. The semiconductor line SGL may be a non-doped region of the crystallized amorphous silicon material layer (e.g., a dopant amount of zero) or a region thereof in which a dopant of a type different from that of the BG line is included at a relatively low concentration compared to that of the BG lines BGL. That is the amount of dopant in the BG lines may be greater than that of the semiconductor line SGL. In an exemplary embodiment, for example, the BG line BGL may include a relatively high-concentration n-type dopant, and the semiconductor line SGL may include a relatively low-concentration p-type dopant. Accordingly, an n-p junction may be formed between the BG line BGL and the semiconductor line SGL.

Since the first gate electrodes 213g used as a doping mask are disposed in a same layer as the first storage electrode C1 of the capacitor among layers formed on the substrate 100, the first gate electrodes 213g may be formed through the same process as the first storage electrode C1, so that the BG lines BGL may be formed using the first gate electrodes 213g without an additional process in the method of manufacturing a display apparatus. Further, since the first gate electrodes 213g may be used as a part of the collective gate electrode (terminal) of the thin film transistor in the pixel, a process of removing the first gate electrodes 213g having been used as a doping mask after the doping process may be omitted to further avoid an additional process in the method of manufacturing the display apparatus.

Figure 5:
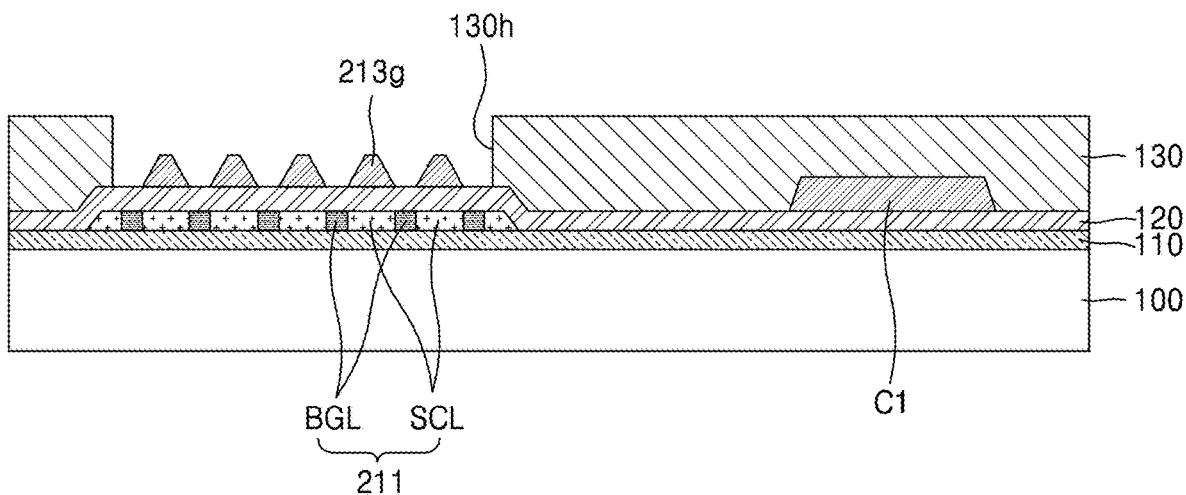

Referring to FIG. 5, a second gate insulation film 130 having an opening 130h in a region corresponding to the driving semiconductor layer 211 is formed.

The second gate insulation film 130 may include an inorganic material such as silicon oxide, silicon nitride and/or silicon oxynitride. The second gate insulation film 130 may be formed by chemical vapor deposition ("CVD") or atomic layer deposition ("ALD"), and then the opening 130h is formed in a region corresponding to the driving semiconductor layer 211 through an etching process.

Figure 6A:
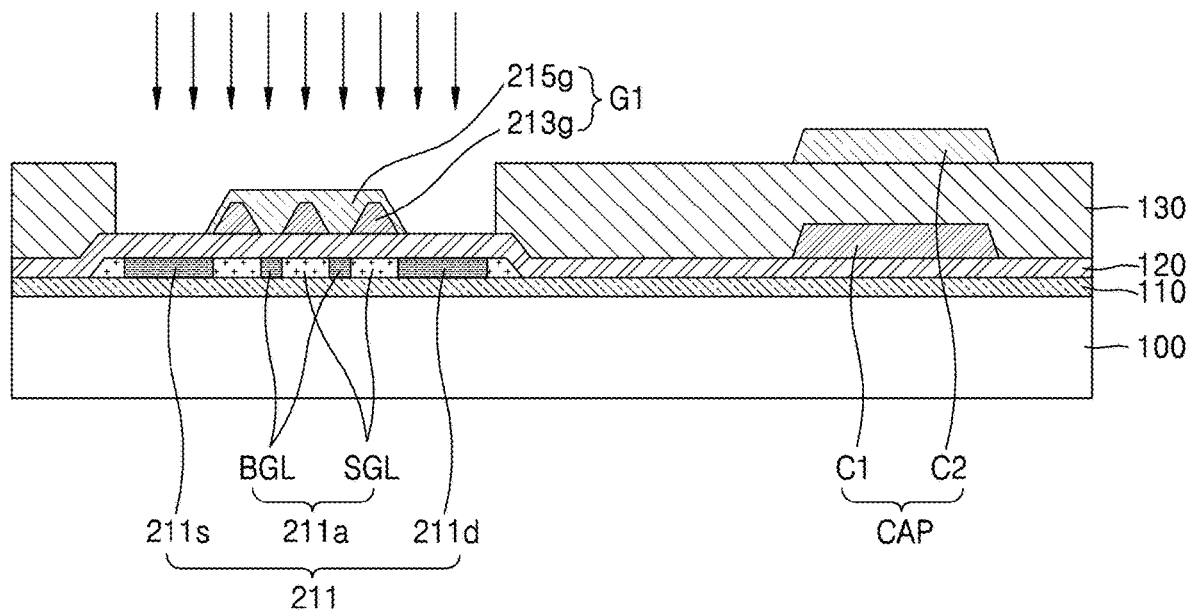
Figure 6B:
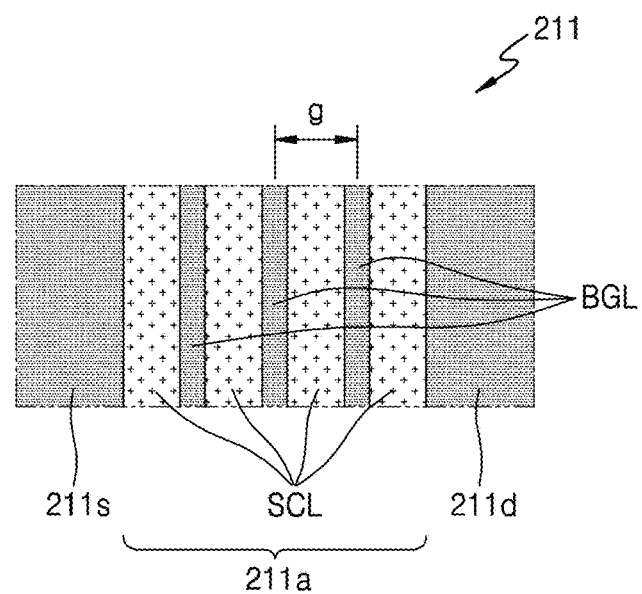
FIG. 6B is a top plan view of an exemplary embodiment of a structure of a semiconductor layer in the method of manufacturing the display apparatus.

Referring to FIG. 6A, a second gate electrode 215g covering the plurality of first gate electrodes 213g, and a second storage electrode C2 of the capacitor are formed.

In order to form the second gate electrode 215g and the second storage electrode C2, a second gate electrode material layer (not shown) is formed over the entire surface of the substrate 100. A photoresist pattern is formed on the second gate electrode material layer, and the second gate electrode material layer is etched using the photoresist pattern, thereby forming the second gate electrode 215g and the second storage electrode C2. The etching of the second gate electrode material layer may also remove a portion of the first gate electrodes 213g at the source and drain regions of the driving semiconductor layer 211

Each of the second gate electrode 215g and the second storage electrode C2 may include molybdenum (Mo), aluminum (Al), copper (Cu), and/or titanium (Ti), may be formed as a single layer film or a multilayer film.

The second gate electrode 215g is formed to cover all of the remaining first gate electrodes 213g within the first-doped driving semiconductor layer 211, and is formed not to overlap remaining portions of the first-doped driving semiconductor layer 211 from which the source region 211s and drain region 211d will be formed. Thereby, a driving gate electrode G1 including the covered first gate electrodes 213g and the second gate electrode 215g is completed.

The second storage electrode C2 is formed on the second gate insulation film 130 to overlap the first storage electrode C1. Thereby, a capacitor CAP including the first storage electrode C1 and the second storage electrode C2 is completed.

A second doping process is performed to inject a dopant (downward arrows in FIG. 6A) into the first-doped driving semiconductor layer 211 including the BG lines BGL and semiconductor lines SGL alternated with each other therein, using the second gate electrode 215g as a doping mask. End portions of the first-doped driving semiconductor layer 211 are exposed by the driving gate electrode G1. The source region 211s and the drain region 211d may be formed in the driving semiconductor layer 211 from the exposed portions thereof, through the second doping process.

Each of the source region 211s and the drain region 211d may be an electrically conductive region formed by increasing the concentration of carriers. Each of the source region 211s and the drain region 211d may be formed by doping the driving semiconductor layer 211 with a relatively high-concentration n-type or p-type dopant. In some embodiments, the concentration of the dopant in the source region 211s and the drain region 211d may be in a range of about 1E14 to 1E15 ions/cm³ ($1\times10^{14}$ to $1\times10^{15}$ ions/cm³).

The dopant injected through the second doping process may be the same type as the dopant included in the BG lines BGL formed in the first doping process. In an exemplary embodiment, for example, the BG lines BGL, the source region 211s and the drain region 211d may all be doped with an n-type dopant. Or, the BG lines BGL, the source region 211s and the drain region 211d may all be doped with a p-type dopant.

As the dopant for n-type doping, phosphorous (P), arsenic (As), antimony (Sb), bismuth (Bi), or the like may be used. As the dopant for p-type doping, boron (B), aluminum (Al), indium (In), gallium (Ga), or the like may be used.

FIG. 6B is a top plan view schematically illustrating an exemplary embodiment of the driving semiconductor layer 211 in which the BG lines BGL are formed. Referring to FIG. 6B, lengths of the BG lines BGL are disposed parallel to lengths of the semiconductor lines SCL in a channel region 211a. The BG lines BGL are disposed adjacent to the semiconductor lines SCL to as to form an interface therebetween at which the BG lines BGL "intersect" the semiconductor lines SCL. The BG lines BGL are formed approximately perpendicular to a virtual line connecting the source region 211s and the drain region 211d to each other, that is, a direction in which electrical current flows in the thin film transistor. Due to the formation of the BG lines BGL, a leakage of electrical current within a thin film transistor can be reduced, and a hot (charge) carrier phenomenon can be reduced or effectively prevented.

A gap 'g' between BG lines BGL adjacent to each other may be about 0.2 micrometer (μm) to about 0.6 μm. In an exemplary embodiment, such gap 'g' maybe taken between centers of the BG lines BGL or between facing edges thereof. During a relatively high-temperature process, in order to reduce or effectively prevent the increase in electrical current leakage and the deterioration in reliability of elements on the substrate 100, which are caused by the lateral diffusion of ion-injected dopants, the gap 'g' between the BG lines BGL may be about 0.2 μm or more. Further, since a grain size effect can be eliminated by maintaining the gap 'g' small enough to match the grain size of a polycrystalline silicon film to reduce the barriers and traps existing in a grain boundary, the gap 'g' between the BG lines BGL may be about 0.6 μm or less.

Since the BG lines BGL are formed using the first gate electrodes 213g as a doping mask, a planar shape of each of the first gate electrodes 213g may be formed to correspond to that of each of the semiconductor lines SCL. That is, the plurality of first gate electrodes 213g may be spaced apart from each other, and may have a shape of a line or bar having a length extending perpendicular to the flow of electrical current within the thin film transistor.

Figure 7:
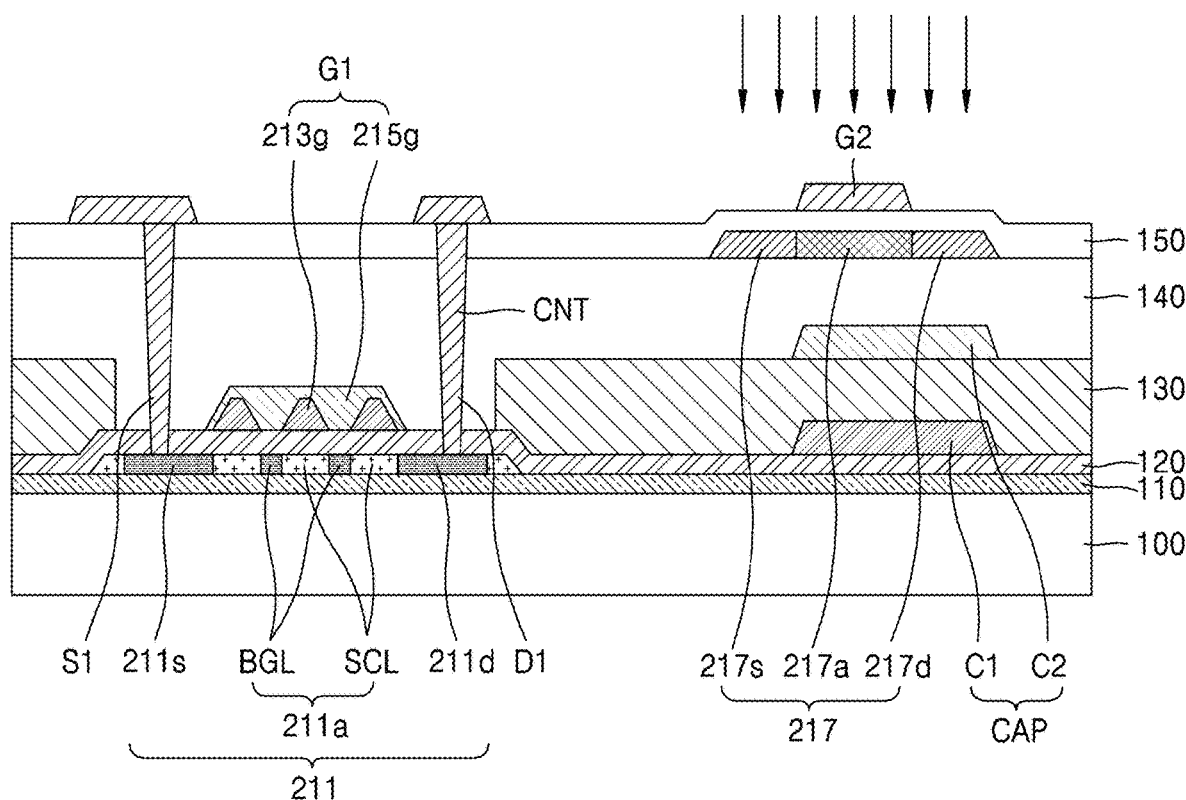

Referring to FIG. 7, a first planarization film 140 is formed over the entire surface of the substrate 100 to cover the second gate electrode 215g and the capacitor CAP.

The first planarization film 140 may cover elements of the driving thin film transistor TFT1, and may serve to planarize the upper portion corresponding to such elements of the driving thin film transistor TFT1. The first planarization film 140 may include or be made of an organic material such as acryl, benzocyclobutene ("BCB"), or hexamethyldisiloxane ("HMDSO"). Further, the first planarization film 140 may include an inorganic material such as silicon oxide, silicon nitride and/or silicon oxynitride. The first planarization film 140 may be formed through chemical vapor deposition ("CVD") or atomic layer deposition ("ALD"). The first planarization film 140 may be an organic-inorganic composite film, or may be formed by laminating an organic layer and an inorganic layer. After the first planarization film 140 is formed, a grinding process may be performed to planarize the upper surface thereof.

A switching semiconductor layer 217 is formed on the first planarization film 140. The switching semiconductor layer 217 may include or be formed of polysilicon obtained by crystallizing amorphous silicon. The crystallization of amorphous silicon may be performed by laser annealing or furnace annealing using an excimer laser or a YAG laser. A photoresist pattern is formed on a portion of the crystallized amorphous silicon at which the switching semiconductor layer 217 is to be formed, and then the switching semiconductor layer 217 is formed by wet etching the crystallized amorphous silicon, dry etching the crystallized amorphous silicon or a combination thereof. A doping process of injecting a relatively low-concentration dopant into the switching semiconductor layer 217 may be additionally performed, such as to form a source region 217*s* and a drain region 217*d* at opposing sides of a channel region 217*a*.

A third gate insulation film 150 covering the switching semiconductor layer 217 is formed. The third gate insulating layer 150 may include an inorganic material such as silicon oxide, silicon nitride, and/or silicon oxynitride, and may be formed through chemical vapor deposition ("CVD") or atomic layer deposition ("ALD").

A driving source electrode S1 and a driving drain electrode D1, which are connected with the source region 211*s* and drain region 211*d* of the driving semiconductor layer 211, respectively, and a switching gate electrode G2 disposed to overlap the switching semiconductor layer 217 are formed.

The driving source electrode S1 and the driving drain electrode D1 may be disposed on the third gate insulation film 150, and may be connected to the source region 211*s* and drain region 211*d* of the driving semiconductor layer 211, respectively, at through-holes CNT penetrating the third gate insulation film 150, the first planarization film 140, the second gate insulation film 130 and the first gate insulation film 120.

The switching gate electrode G2 is disposed on the third gate insulation film 150, and overlaps a portion of the crystallized amorphous silicon layer from which the channel region 217*a* of the switching semiconductor layer 217 is to be formed.

The driving source electrode S1, the driving drain electrode D1 and the switching gate electrode G2 may be disposed in a same layer among layers formed on the substrate 100, and may be formed as a single layer film or multilayer film made of a conductive material having good conductivity. Each of the driving source electrode S1, the driving drain electrode D1 and the switching gate electrode G2 may be a single layer film or multilayer film made of a conductive material including aluminum (Al), copper (Cu), and/or titanium (Ti). The driving source electrode S1, the driving drain electrode D1, and the switching gate electrode G2 may be formed through an etching process after depositing a metal material layer through chemical vapor deposition ("CVD") or atomic layer deposition ("ALD").

A third doping process may be performed to form the source region 217*s* and the drain region 217*d* by injecting a dopant into the crystallized amorphous silicon layer used for forming the switching semiconductor layer 217 using the switching gate electrode G2 as a doping mask.

Each of the source region 217*s* and the drain region 217*d* may be a conductive region formed by increasing the concentration of (electrical charge) carriers. Each of the source region 217*s* and the drain region 217*d* may be formed by doping the crystallized amorphous silicon layer for forming the switching semiconductor layer 217 with a relatively high-concentration n-type or p-type dopant. In some embodiments, the concentration of the dopant in the source region 217*s* and the drain region 217*d* may range from about 1E14 to 1E15 ions/cm$^3$ ($1\times10^{14}$ to $1\times10^{15}$ ions/cm$^3$).

The dopant injected at the source region 217*s* and drain region 217*d* of the switching semiconductor layer 217 may have a different type from the dopant injected into the source region 211*s* and drain region 211*d* of the driving semiconductor layer 211. In an exemplary embodiment, for example, the dopant injected into the source region 217*s* and drain region 217*d* of the switching semiconductor layer 217 may be a p-type dopant, and the dopant injected into the source region 211*s* and drain region 211*d* of the driving semiconductor layer 211 an n-type dopant. Accordingly, the switching thin film transistor TFT2 may be a pMOS transistor, and the driving thin film transistor TFT1 may be an nMOS transistor.

Figure 8:
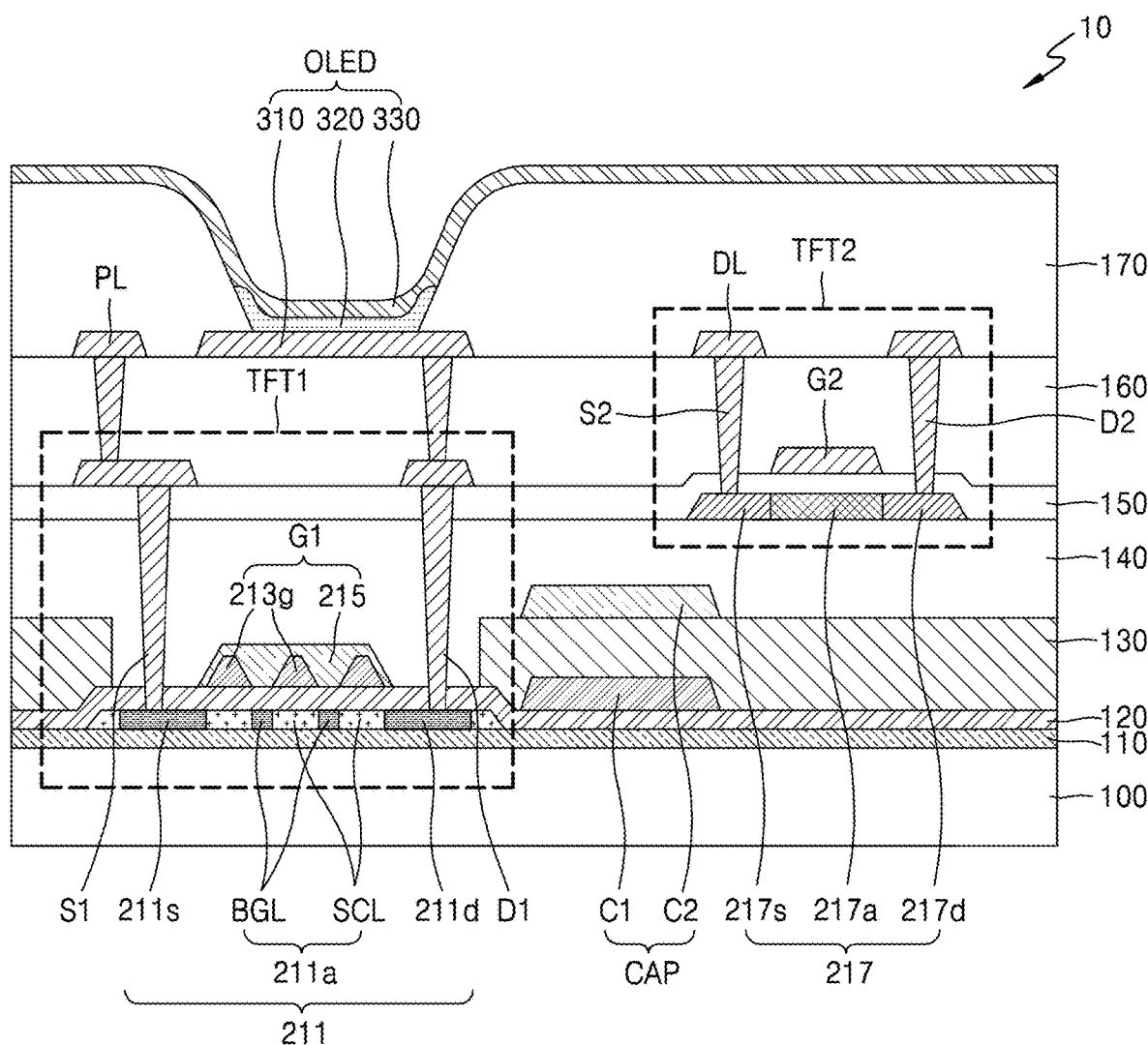

Referring to FIG. 8, a second planarization film 160 is formed over the entire surface of the substrate 100 to cover elements of the switching thin film transistor TFT2, and an organic light emitting device OLED is formed on the second planarization film 160.

The second planarization film 160 may cover elements of the switching thin film transistor TFT2, and may serve to planarize the upper portion of the switching thin film transistor TFT2 corresponding to such elements. The second planarization film 160 may include or be made of an organic material such as acryl, benzocyclobutene ("BCB"), or hexamethyldisiloxane ("HMDSO"). Further, the second planarization film 160 may include an inorganic material such as silicon oxide, silicon nitride, and/or silicon oxynitride. The second planarization film 160 may be formed through chemical vapor deposition ("CVD") or atomic layer deposition ("ALD"). The second planarization film 160 may be an organic-inorganic composite film, or may be formed by laminating an organic layer and an inorganic layer. After the second planarization film 160 is formed, a grinding process may be performed to planarize the upper surface thereof.

An organic light emitting device OLED including a pixel electrode 310, a counter electrode 330, and an intermediate layer 320 disposed between the pixel electrode 310 and the counter electrode 330 and including a light emitting layer may be disposed on the second planarization film 160. As shown in FIG. 8, the pixel electrode 310 is in contact with any one of the driving source electrode S1 and the driving drain electrode D1 through an opening formed in the second planarization film 160 to be connected with the driving thin film transistor TFT1. It is shown in FIG. 8 that the pixel electrode 310 is connected with the driving drain electrode D1.

The driving voltage line PL, the data line DL, the switching source electrode S2, and the switching drain electrode D2 may be disposed in the same layer as that of the pixel electrode 310. The driving voltage line PL may be connected to the driving source electrode S1 of the driving thin film transistor TFT1, and the data line DL may be connected to the switching source electrode S2 of the switching thin film transistor TFT2.

The pixel electrode 310 may be a transparent electrode or a reflective electrode. When the pixel electrode 310 is a transparent electrode, the pixel electrode 310 may include indium tin oxide ("ITO"), indium zinc oxide ("IZO"), ZnO or $In_2O_3$. When the pixel electrode 310 is a reflective electrode, the pixel electrode 310 may include a reflective film including or made of Ag, Mg, Al, Pt, Pd, Au, Ni, Nd, Ir, Cr, or a compound thereof, and a transparent film made of ITO, IZO, ZnO, or $In_2O_3$. In some embodiments, the pixel electrode 310 may have an ITO/Ag/ITO structure.

The driving voltage line PL, the data line DL, the switching source electrode S2 and/or the switching drain electrode D2 may be formed in the same layer as that of the pixel electrode 310, and may be formed from the same material layer at the same time in a method of manufacturing the display apparatus.

A pixel defining layer 170 may be disposed on the second planarization layer 160. The pixel defining layer 170 serves to define a pixel by having an opening corresponding to each of sub-pixels, that is, an opening through which at least a central portion of the pixel electrode 310 is exposed. Further, as shown in FIG. 8, the pixel defining layer 170 serves to effectively prevent (electrical) arc or the like from occurring at the edge of the pixel electrode 310 by increasing the distance between the edge of the pixel electrode 310 and the counter electrode 330 which is disposed over the pixel electrode 310. The pixel defining layer 170 may include be formed of an organic material such as polyimide or hexamethyldisiloxane ("HMDSO").

The intermediate layer 320 of the organic light emitting device may include a relatively low molecular weight or relatively high molecular weight material. When the intermediate layer 320 includes a relatively low molecular weight material, the intermediate layer 320 may have a single or composite structure in which a hole injection layer ("HIL"), a hole transport layer ("HTL"), an emission layer ("EML"), an electron transport layer ("ETL"), and an electron Injection Layer ("EIL") are laminated. Further, the intermediate layer 320 may include various organic materials such as copper phthalocyanine ("CuPc"), N,N'-di(naphthalen-1-yl)-N,N'-diphenyl-benzidine ("NPB"), and tris-8-hydroxyquinoline aluminum (Alq3). Such layers may be formed by vacuum deposition.

When the intermediate layer 320 includes a relatively high molecular weight material, the intermediate layer 320 may have a structure including a hole transport layer ("HTL") and an emission layer ("EML"). In this case, the hole transport layer ("HTL") may include poly(3,4-ethylenedioxythiophene) ("PEDOT"), and the emission layer ("EML") may include a polymer material such as polyphenylenevinylene ("PPV") and polyfluorene. The intermediate layer 320 may be formed by a screen printing method, an inkjet printing method, a laser induced thermal imaging ("LITI") method, or the like.

Of course, the intermediate layer 320 is not necessarily limited thereto, and may have various structures. The intermediate layer 320 may include a layer integrated with the plurality of pixel electrodes 310, and may include a layer patterned corresponding to each of the plurality of pixel electrodes 310.

The counter electrode 330 is disposed to face the pixel electrode 310 with the intermediate layer 320 interposed therebetween. The counter electrode 330 may be formed integrally with the plurality of organic light emitting devices to correspond to the plurality of pixel electrodes 310. That is, the pixel electrode 310 may be patterned separately for each pixel, or the counter electrode 330 may be commonly formed to all the pixels to apply a common voltage to all the pixels. The counter electrode 330 may be a transparent electrode or a reflective electrode.

The holes and electrons emitted from the pixel electrode 310 and counter electrode 330 of the organic light emitting device OLED may be combined with each other in the light emitting layer of the intermediate layer 320 to generate light which is emitted at the pixel PX of the display apparatus 10 manufactured by the above-described method.

Since the organic light emitting device OLED can be easily damaged by moisture or oxygen from outside thereof, the display apparatus 10 may further include a thin film sealing layer (not shown) or a sealing substrate (not shown) to cover and protect the organic light emitting device OLED which is on the substrate 100. In addition, the display apparatus 10 can be variously modified by further disposing a polarizing layer (not shown), a color filter layer (not shown), a touch layer (not shown) and the like on the thin film sealing layer or the sealing substrate.

As described above, the display apparatus according to one or more embodiments employs a thin film transistor having bridged grain ("BG") lines to exhibit excellent electrical performance, such that the BG lines are formed without an additional process to efficiently perform a method of manufacturing the display apparatus.

FIGS. 9A, 9D and FIGS. 10 to 12 are cross-sectional views illustrating a structure of a display apparatus in another exemplary embodiment of a method of manufacturing a display apparatus, according to the invention. FIGS. 9B and 9C are photographs of the structure of the display apparatus in the method of manufacturing the display apparatus of FIGS. 9A and 10-12. A thickness of layers of the display apparatus in FIGS. 9A, 9B, 9D, 10 and 11 is defined in the vertical direction of the views, e.g., the third (z) direction. FIG. 9C is a view from the top of a plane defined in the first (x) and second (y) directions.

The display apparatus 20 includes a first thin film transistor TFT11 which is a bottom gate type transistor where a first gate electrode G11 is disposed under a first semiconductor layer 223, and a second thin film transistor TFT22 which is a top gate type transistor where a second gate electrode G22 is disposed over a second semiconductor layer 225. In this case, the first thin film transistor TFT11 and the second thin film transistor TFT22 are laminated to each other, and the first thin film transistor TFT11 has a plurality of bridged grain ("BG") lines in a channel region 223a.

Figure 9A:
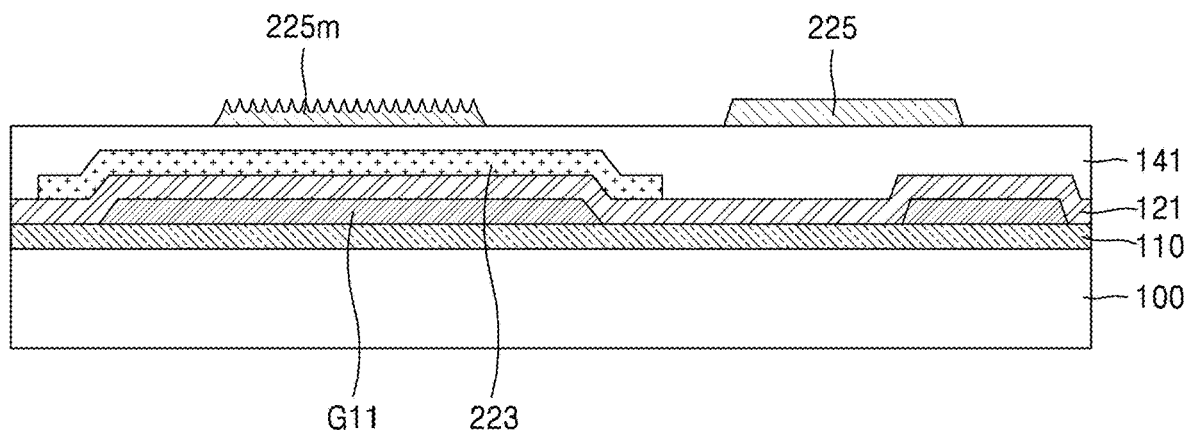
FIGS. 9A, 9D and FIGS. 10 to 12 are cross-sectional views schematically illustrating a structure of a display apparatus in another exemplary embodiment of a method of manufacturing the display apparatus, according to the invention.
Figure 9B:
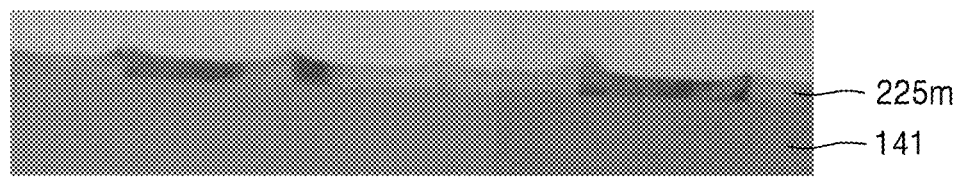
FIGS. 9B and 9C are photographs of the structure of the display apparatus in the method of manufacturing the display apparatus of FIGS. 9A and 10-12.
Figure 9C:
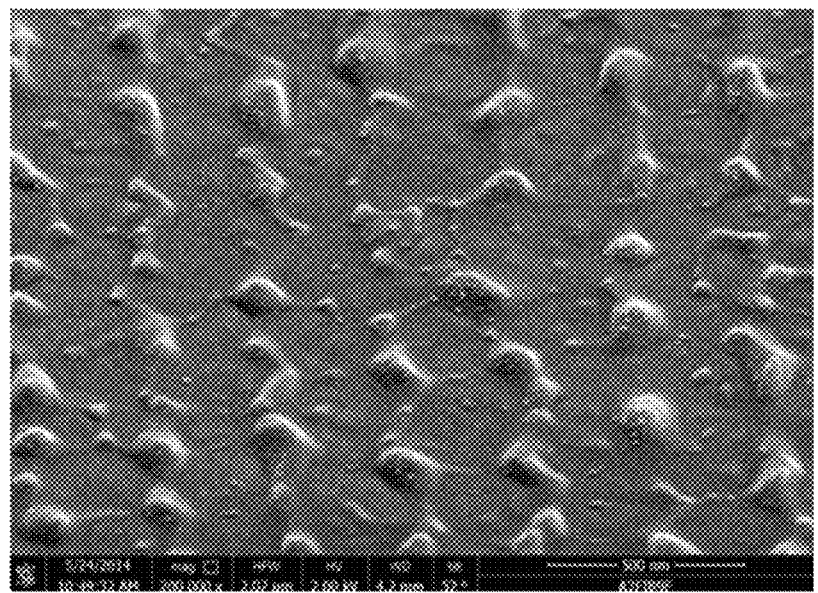

Referring to FIG. 9A, a buffer film 110, a first gate electrode G11, and a first gate insulation film 121 are formed on a substrate 100.

The substrate 100 may include or be made of various materials such as glass, metal, and plastic. According to an embodiment, the substrate 100 may be a substrate 100 including or made of a flexible material. Here, the substrate 100 including a flexible material refers to a substrate that is easily deformed, bent, and folded or rolled. This substrate 100 may include various materials having flexible or bendable properties, and examples thereof may include polymer resins such as polyethersulphone ("PES"), polyacrylate ("PAR"), polyetherimide ("PEI"), polyethyelenene naphthalate ("PEN"), polyethyelene terepthalate ("PET"), polyphenylene sulfide ("PPS"), polyallylate, polyimide ("PI"), polycarbonate ("PC"), and cellulose acetate propionate.

The buffer film 110 may be disposed on the substrate 100 to reduce or effectively prevent the penetration of foreign matter, moisture or external air from the lower portion of the substrate 100 and provide a flat surface on the substrate. The buffer film 110 may include an inorganic material such as an oxide or a nitride, an organic material, or an inorganic-organic composite material, and may be a single layer or multilayer structure of an inorganic material and an organic material. The buffer film 110 may be omitted in some cases.

The buffer film 110 may be formed through various deposition processes. In an exemplary embodiment, for example, the buffer film 110 may be formed by chemical vapor deposition ("CVD") or atomic layer deposition ("ALD").

The first gate electrode G11 is formed on the buffer film 110. The first gate electrode G11 may be formed by forming a metal material layer by a deposition method such as a chemical vapor deposition ("CVD"), plasma enhanced CVD ("PECVD"), lower pressure CVD ("LPCVD"), physical vapor deposition ("PVD"), sputtering, or atomic layer deposition ("ALD") and then etching the metal material layer.

The first gate electrode G11 may include molybdenum (Mo), aluminum (Al), copper (Cu), and/or titanium (Ti), and may be formed as a single layer film or a multilayer film. In some embodiments, the first gate electrode G11 may be formed of a double layer film of Ti/Cu or Ti/Al. In this case, the Ti layer is disposed at the bottom, is formed to be thinner than the Cu layer or the Al layer, and thus functions as a barrier.

The first gate insulation film 121 is formed over the entire surface of the substrate 100 to cover the first gate electrode G11. The first gate insulating layer 121 may include an inorganic material such as silicon oxide, silicon nitride, and/or silicon oxynitride, and may be formed by chemical vapor deposition ("CVD") or atomic layer deposition ("ALD").

A first semiconductor material layer for forming the first semiconductor layer 223 is formed on the first gate insulation film 121 to overlap the first gate electrode G11. The first semiconductor material layer may include or be formed of polysilicon obtained by crystallizing amorphous silicon. The crystallization of amorphous silicon may be performed by laser annealing or furnace annealing using excimer laser or YAG laser. A photoresist pattern is formed on a portion of the first semiconductor material layer from which the first semiconductor layer 223 is to be formed, and then the first semiconductor material layer is etched by wet etching, dry etching, or a combination thereof, using the photoresist pattern, so as to form the patterned first semiconductor layer 223 indicated in FIG. 9A. The patterned first semiconductor layer 223 and the second semiconductor layer 225 indicated in FIG. 9A is undoped.

A first planarization film 141 is formed over the entire surface of the substrate 100 to cover the patterned first semiconductor layer 223. The first planarization film 141 may cover the patterned first semiconductor layer 223, and may serve to planarize the upper portion of the patterned first semiconductor layer 223. The first planarization film 141 may include or be made of an organic material such as acryl, benzocyclobutene ("BCB"), or hexamethyldisiloxane ("HMDSO"). The first planarization film 141 may include an inorganic material such as silicon oxide, silicon nitride, and/or silicon oxynitride. In this case, the first planarization film 141 may be formed through chemical vapor deposition ("CVD") or atomic layer deposition ("ALD"). The first planarization film 141 may be an organic-inorganic composite film, or may be formed by laminating an organic layer and an inorganic layer. After the first planarization film 141 is formed, a grinding process may be performed to planarize the upper surface thereof.

A second semiconductor material layer for forming a semiconductor mask layer 225$m$ and a second semiconductor layer 225 are formed on the first planarization film 141. The semiconductor mask layer 225$m$ and the second semiconductor layer 225 may be formed of polysilicon obtained by crystallizing amorphous silicon. The crystallization of amorphous silicon may be performed by laser annealing or furnace annealing using an excimer laser or a YAG laser. A photoresist pattern is formed on a portion of the second semiconductor material layer from which the semiconductor mask layer 225$m$ and the second semiconductor layer 225 are to be formed, and then the second semiconductor material layer is etched by wet etching, dry etching, or a combination thereof, using the photoresist pattern, so as to form the semiconductor mask layer 225$m$ and the second semiconductor layer 225 shown in FIG. 9A.

Figure 9D:
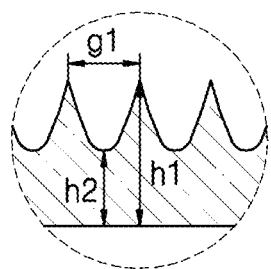

The semiconductor mask layer 225$m$ may be formed corresponding to a portion where the channel region 223$a$ of the final first semiconductor layer 223 is to be formed. Referring to FIG. 9D, the semiconductor mask layer 225$m$ includes a plurality of protrusions. The height h1 of each of the protrusions may be about 60 nanometers (nm) to about 80 nm, and the height h2 of a region between the protrusions (e.g., a valley) may be about 40 nm to about 50 nm. The gap g1 between the protrusions may be about 0.2 μm to about 0.3 μm. The height of each of the protrusions and the gap between the protrusions can be adjusted by changing the energy density of a laser and/or the pitch of a laser pulse during the crystallization process.

FIGS. 9B and 9C show photographic images in which protrusions are defined at an upper surface of the semiconductor mask layer 225$m$ layer using an excimer laser. Referring to FIGS. 9B and 9C, it can be seen that the protrusions are arranged at regular intervals along one direction (the x direction). Further, it can be seen that the protrusions are arranged in a line so as to lengthwise extend to each other along a direction (the y direction) intersecting the one (x) direction. The height of each of the protrusions and the gap between the protrusions can be adjusted by changing the energy density of a laser and/or the pitch of a laser pulse.

Figure 10:
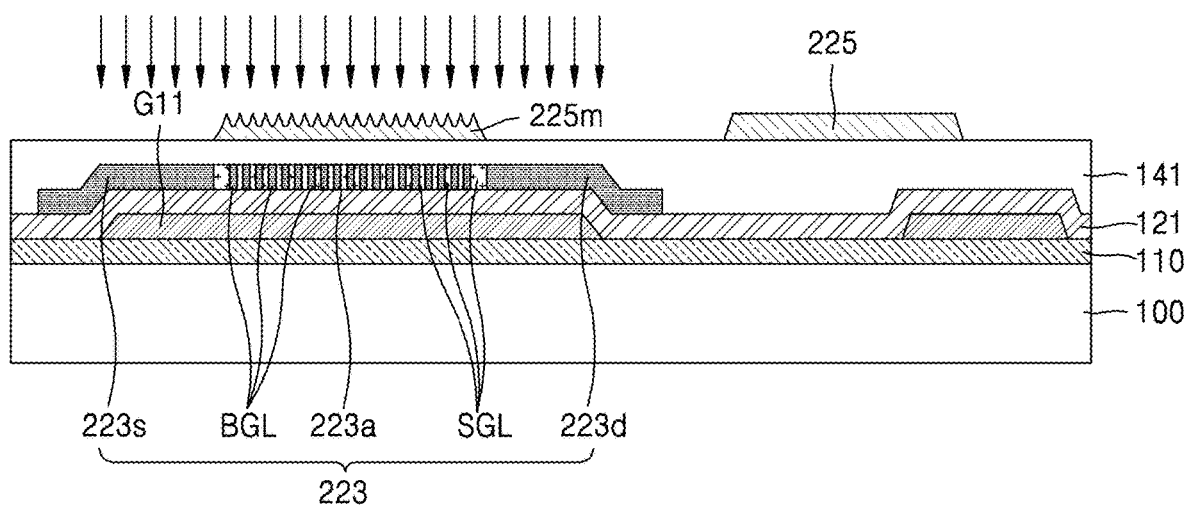

Referring to FIG. 10, a BG-SD doping process is performed to form conductive BG lines BGL, a source region 223$s$ and a drain region 223$d$ by injecting a dopant into the patterned first semiconductor layer 223 using the semiconductor mask layer 225$m$ as a doping mask.

The dopant may be an n-type or p-type dopant. The n-type dopant may be phosphorus (P), arsenic (As), antimony (Sb), bismuth (Bi), or the like. The p-type dopant may be boron (B), aluminum (Al), indium (In), gallium (Ga), or the like.

The BG-SD doping process is a process of forming the BG lines BGL, the source region 223$s$ and the drain region 223$d$ from the undoped patterned first semiconductor layer 223. In the BG-SD doping process, a relatively high-concentration dopant may be injected such that each of the BG lines BGL, the source region 223$s$ and the drain region 223$d$ has conductivity. In an exemplary embodiment, for example, in the BG-SD doping process, a dopant having a concentration of about 1E12 to 1E13 ions/cm³ ($1\times10^{12}$ to $1\times10^{13}$ ions/cm³) may be injected.

In this case, since the injection energy of the dopant is adjusted such that the patterned first semiconductor layer 223 is doped with the dopant, the dopant may not be injected into the second semiconductor layer 225, or only a very small amount of the dopant injected into the second semiconductor layer 225.

By the formation of the plurality of BG lines, a semiconductor line SGL disposed between the BG lines may be formed. The semiconductor line SGL may be a non-doped region or a region in which a dopant of a type different from that of the BG line is included at a relatively low concentration. In an exemplary embodiment, for example, the BG line may include a relatively high-concentration n-type dopant, and the semiconductor line SGL may include a relatively low-concentration p-type dopant. Accordingly, an n-p junction may be formed between the BG line and the semiconductor line SGL.

Since the semiconductor mask layer 225m used as a doping mask is formed through the same process and from a same material layer as the second semiconductor layer 225, the BG lines BGL may be formed without an additional process in the method of manufacturing a display apparatus. Further, since the semiconductor mask layer 225m does not influence the performance of the first thin film transistor TFT11 (refer to FIG. 12), a process of removing the semiconductor mask layer 225m having been used as a doping mask after the doping process may be omitted to further avoid an additional process in the method of manufacturing the display apparatus.

When using the semiconductor mask layer 225m, the gap g1 (refer to FIG. 9A) between the protrusions can be adjusted to a gap that cannot be formed by the photoresist patterning process described above. Since a number of the BL lines may be defined by the protrusions and gaps therebetween, a relatively larger number of the BG lines can be arranged in the channel region 223a.

Figure 11:
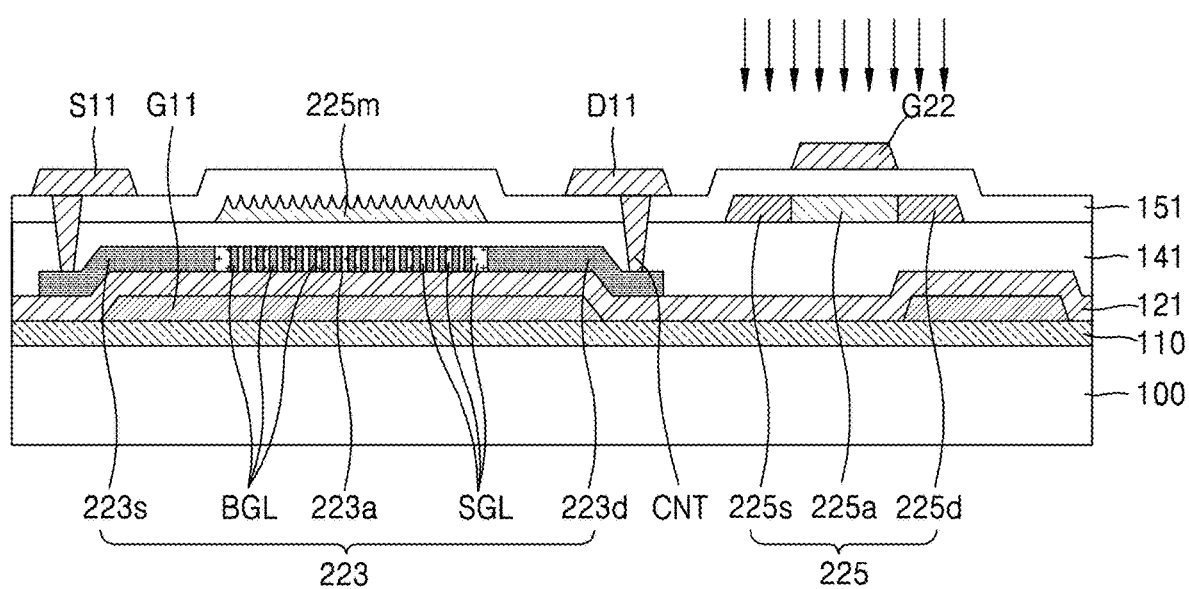

Referring to FIG. 11, a second gate insulation layer 151 is formed over the entire surface of the substrate 100 so as to cover the semiconductor mask layer 225m and the second semiconductor layer 225.

The second gate insulation film 151 may include an inorganic material such as silicon oxide, silicon nitride, and/or silicon oxynitride. The second gate insulation film 151 may be formed by chemical vapor deposition ("CVD") or atomic layer deposition ("ALD").

A first source electrode S11, a first drain electrode D11 and a second gate electrode G22 are formed on the second gate insulation film 151. The first source electrode S11, the first drain electrode D11 and the second gate electrode G22 may be disposed in the same layer as each other, and may be formed as a single film or multilayer film made of a conductive material having relatively good conductivity. Each of the first source electrode S11, the first drain electrode D11 and the second gate electrode G22 may be a single film or multilayer film made of a conductive material including aluminum (Al), copper (Cu), and/or titanium (Ti). The first source electrode S11, the first drain electrode D11 and the second gate electrode G22 may be formed through an etching process after depositing a metal material layer through chemical vapor deposition ("CVD") or atomic layer deposition ("ALD").

The first source electrode S11 and the first drain electrode D11 may be connected to the source region 223s and drain region 223d, respectively, through a through-hole CNT penetrating the second gate insulation film 151, the first planarization film 141, and the first gate insulation film 121.

The second gate electrode G22 is disposed on the second gate insulation film 151, and is formed to overlap a portion where the channel region 225a of the final second semiconductor layer 225 is to be formed.

An SD doping process is performed to form the source region 225s and the drain region 225d by using the second gate electrode G22 as a doping mask.

Each of the source region 225s and the drain region 225d may be a conductive region formed by increasing the concentration of (electrical charge) carriers of portions of the undoped second semiconductor layer 225. Each of the source region 225s and the drain region 225d may be formed by doping the undoped second semiconductor layer 225 with a relatively high-concentration n-type or p-type dopant. In some embodiments, the concentration of the dopant in the source region 225s and the drain region 225d may range from about 1E14 to 1E15 ions/cm³.

The dopant injected at the source region 223s and drain region 223d of the undoped first semiconductor layer 223 may have a different type from the dopant injected into the source region 225s and drain region 225d of the second semiconductor layer 225. Accordingly, the first thin film transistor TFT11 may be an nMOS transistor, and the second thin film transistor TFT22 may be a pMOS transistor.

Figure 12:
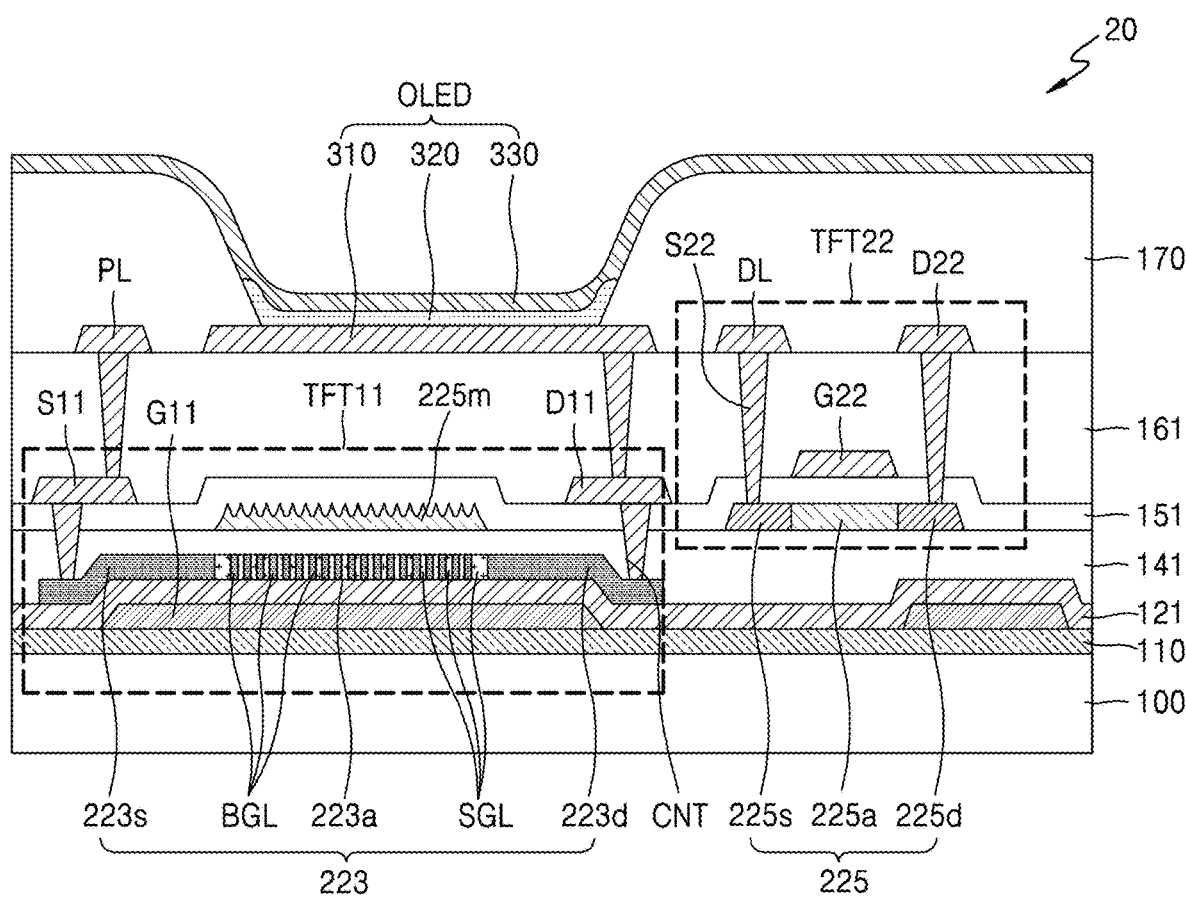

Referring to FIG. 12, a second planarization film 161 is formed over the entire surface of the substrate 100 to cover elements of the second thin film transistor TFT22, and an organic light emitting device OLED is formed on the second planarization film 161.

The second planarization film 161 may cover elements the switching thin film transistor TFT22, and may serve to planarize the upper portion corresponding to such elements of the switching thin film transistor TFT22. The second planarization film 161 may include or be made of an organic material such as acryl, benzocyclobutene ("BCB"), or hexamethyldisiloxane ("HMDSO"). The second planarization film 161 may include an inorganic material such as silicon oxide, silicon nitride, and/or silicon oxynitride. The second planarization film 161 may be formed through chemical vapor deposition ("CVD") or atomic layer deposition ("ALD"). The second planarization film 161 may be an organic-inorganic composite film, or may be formed by laminating an organic layer and an inorganic layer. After the second planarization film 161 is formed, a grinding process may be performed to planarize the upper surface thereof.

The organic light emitting device OLED including a pixel electrode 310, a counter electrode 330, and an intermediate layer 320 which is disposed between the pixel electrode 310 and the counter electrode 330 and including a light emitting layer may be disposed on the second planarization film 161. As shown in FIG. 12, the pixel electrode 310 is in contact with any one of the first source electrode S11 and the first drain electrode D11 through an opening formed in the second planarization film 161 to be connected with the first thin film transistor TFT11. It is shown in FIG. 12 that the pixel electrode 310 is connected with the first drain electrode D11.

The driving voltage line PL, the data line DL, the switching source electrode S22, and the switching drain electrode D22 may be disposed in the same layer as the pixel electrode 310. The driving voltage line PL may be connected to the driving source electrode S11 of the driving thin film transistor TFT11, and the data line DL may be connected to the switching source electrode S22 of the switching thin film transistor TFT22.

The pixel electrode 310 may be a transparent electrode or a reflective electrode. When the pixel electrode 310 is a transparent electrode, the pixel electrode 310 may include ITO, IZO, ZnO, or $In_2O_3$. When the pixel electrode 310 is a reflective electrode, the pixel electrode 310 may include a reflective film made of Ag, Mg, Al, Pt, Pd, Au, Ni, Nd, Ir, Cr, or a compound thereof, and a transparent film made of ITO, IZO, ZnO, or $In_2O_3$. In some embodiments, the pixel electrode 310 may have an ITO/Ag/ITO structure.

The driving voltage line PL, the data line DL, the switching source electrode S2, and/or the switching drain electrode D2 may be formed in the same layer as the pixel electrode 310, and may be formed of and from the same material layer at the same time in a method of manufacturing the display apparatus.

A pixel defining layer 170 may be disposed on the second planarization layer 161. The pixel defining layer 170 serves to define a pixel by having an opening corresponding to each of sub-pixels, that is, an opening through which at least a central portion of the pixel electrode 310 is exposed. Further, as shown in FIG. 8, the pixel defining layer 170 serves to effectively prevent (electrical) arc or the like from occurring at the edge of the pixel electrode 310 by increasing the distance between the edge of the pixel electrode 310 and the counter electrode 330 which is disposed over the pixel electrode 310. The pixel defining layer 170 may include or be formed of an organic material such as polyimide or hexamethyldisiloxane ("HMDSO").

The intermediate layer 320 of the organic light emitting device OLED may include a relatively low molecular weight or relatively high molecular weight material. When the intermediate layer 320 includes a relatively low molecular weight material, the intermediate layer 320 may have a single or composite structure in which a hole injection layer ("HL"), a hole transport layer ("HTL"), an emission layer ("EML"), an electron transport layer ("ETL"), and an electron injection layer ("EIL") are laminated. Further, the intermediate layer 320 may include various organic materials such as copper phthalocyanine ("CuPc"), N,N'-di(naphthalen-1-yl)-N,N'-diphenyl-benzidine (NPB), and tris-8-hydroxyquinoline aluminum (Alq3). Such layers may be formed by vacuum deposition.

When the intermediate layer 320 includes a relatively high molecular weight material, the intermediate layer 320 may have a structure including a hole transport layer ("HTL") and an emission layer ("EML"). In this case, the hole transport layer ("HTL") may include PEDOT, and the emission layer ("EML") may include a polymer material such as poly-phenylenevinylene ("PPV") and polyfluorene. The intermediate layer 320 may be formed by a screen printing method, an inkjet printing method, a laser induced thermal imaging ("LITI") method, or the like.

Of course, the intermediate layer 320 is not necessarily limited thereto, and may have various structures. The intermediate layer 320 may include a layer integrated with the plurality of pixel electrodes 310, and may include a layer patterned corresponding to each of the plurality of pixel electrodes 310.

The counter electrode 330 is disposed to face the pixel electrode 310 with the intermediate layer 320 interposed therebetween. The counter electrode 330 may be formed integrally with the plurality of organic light emitting devices to correspond to the plurality of pixel electrodes 310. That is, the pixel electrode 310 may be patterned separately for each pixel, or the counter electrode 330 may be formed commonly to apply a common voltage to all the pixels. The counter electrode 330 may be a transparent electrode or a reflective electrode.

The holes and electrons emitted from the pixel electrode 310 and counter electrode 330 of the organic light emitting device OLED may be combined with each other in the light emitting layer of the intermediate layer 320 to generate light which is emitted at the pixel PX of the display apparatus 10 manufactured by the above-described method.

Since the organic light emitting device OLED can be easily damaged by moisture or oxygen from outside thereof, the display apparatus 20 may further include a thin film sealing layer (not shown) or a sealing substrate (not shown) to cover and protect the organic light emitting device OLED which is on the substrate 100. In addition, the display apparatus 20 can be variously modified by further disposing a polarizing layer (not shown), a color filter layer (not shown), a touch layer (not shown) and the like on the thin film sealing layer or the sealing substrate.

As described above, the display apparatus according to one or more embodiments employs a thin film transistor having bridged grain ("BG") lines to exhibit excellent electrical performance, such that the BG lines are formed without an additional process to efficiently perform a process in a method of manufacturing the display apparatus.

As described above, the display apparatus according to one or more embodiments includes a thin film transistor having bridged grain ("BG") lines in a channel region thereof to exhibit excellent electrical performance, and can form the BG lines without an additional process to reduce process steps and process time in a method of manufacturing such display apparatus. Of course, the scope of the invention is not limited by these effects.

It should be understood that the exemplary embodiments described herein should be considered in a descriptive sense only and not for purposes of limitation. Descriptions of features within each embodiment should typically be considered as available for other similar features in other embodiments.

While one or more embodiments of the invention have been described with reference to the figures, it will be understood by those of ordinary skill in the art that various changes in form and details may be made therein without departing from the spirit and scope of the present as defined by the following claims.

What is claimed is:

1. A display apparatus, comprising:
a first thin film transistor on a substrate; and
a capacitor on the substrate, the capacitor including a first storage electrode and a second storage electrode,
wherein the first thin film transistor includes:
a semiconductor layer disposed on the substrate, including:
a channel region in which are disposed:
a plurality of bridged grain lines defined by portions of the semiconductor layer having an amount of a dopant, and
a plurality of semiconductor lines defined by portions of the semiconductor having a dopant amount less than that of the bridged grain lines and forming an interface with the bridged grain lines, and
source and drain regions respectively disposed at opposing sides of the channel region; and
a gate electrode overlapping the semiconductor layer with a first gate insulation film therebetween, the gate electrode including:

a plurality of first gate electrodes disposed corresponding to the plurality of semiconductor lines, respectively, and a second gate electrode covering the plurality of first gate electrodes.

2. The display apparatus of claim 1, wherein the plurality of the first gate electrodes are disposed in a same layer as that of the first storage electrode of the capacitor and formed from a same material layer as the first storage electrode of the capacitor, and the second gate electrode is formed from a same material layer as the second storage electrode of the capacitor.

3. The display apparatus of claim 1, wherein within the semiconductor layer of the first thin film transistor, the plurality of bridged grain lines of the channel region of the first thin film transistor lengthwise intersect a virtual line extended between the source region and the drain region.

4. The display apparatus of claim 1, wherein the plurality of semiconductor lines are portions of the semiconductor layer which are not doped, or are portions of the semiconductor layer doped with a dopant different from that of the plurality of bridged grain lines.

5. The display apparatus of claim 1, further comprising:

a pixel at which light is emitted to display an image, the first thin film transistor being disposed in the pixel, a switching thin film transistor in the pixel in which the first thin film transistor is disposed, the switching thin film transistor including a switching semiconductor layer and a switching gate electrode, wherein within the pixel, the switching semiconductor layer of the switching thin film transistor is disposed in a different layer from that of the semiconductor layer of the first thin film transistor.

6. The display apparatus of claim 1, further comprising:

a second gate insulation film between the first and second storage electrode of the capacitor, the second gate insulation film extending from the capacitor to the first thin film transistor, and an opening defined in the second gate insulation film at the first thin film transistor, corresponding to the channel region, source region and drain region of the semiconductor layer of the first thin film transistor.

7. A display apparatus, comprising:

a substrate including a pixel at which light is emitted to display an image;

a bottom gate type thin film transistor disposed in the pixel, including:

a first semiconductor layer including a channel region in which are disposed a plurality of bridged grain lines defined by portions of the first semiconductor layer having an amount of a dopant, and a first gate electrode disposed between the substrate and the first semiconductor layer;

a top gate type second thin film transistor in the pixel in which the bottom gate type thin film transistor is disposed, including:

a second semiconductor layer disposed in a different layer from that of the first semiconductor layer of the bottom gate type thin film transistor, and a second gate electrode disposed on the second semiconductor layer to be overlapping with the second semiconductor layer; and a semiconductor mask layer overlapping the channel region of the first semiconductor layer of the bottom gate type thin film transistor, the semiconductor mask layer disposed in a same layer as that of the second semiconductor layer of the top gate type thin film transistor.

8. The display apparatus of claim 7, wherein the semiconductor mask layer includes a plurality of protrusions.

9. The display apparatus of claim 8, wherein a gap respectively between the plurality of protrusions is about 0.2 micrometer to about 0.3 micrometer.

10. The display apparatus of claim 7, wherein the first semiconductor layer of the bottom gate type thin film transistor includes source and drain regions disposed at opposing sides of the channel region, respectively, and within the first semiconductor layer, the plurality of bridged grain lines lengthwise intersect a virtual line extended between the source region and the drain region.

11. The display apparatus of claim 7, wherein the channel region of the first semiconductor layer of the bottom gate type thin film transistor further includes a semiconductor line disposed between the plurality of bridged grain lines, the semiconductor line defined by a portion of the first semiconductor layer having a dopant amount less than that of the bridged grain lines and forming an interface with the bridged grain lines, and the semiconductor line is a portion of the first semiconductor layer which is not doped, or a portion of the first semiconductor layer doped with a dopant different from that of the plurality of bridged grain lines.

12. The display apparatus of claim 7, further comprising:

a first planarization film disposed between the first semiconductor layer of the bottom gate type thin film transistor and the second semiconductor layer of the top gate type thin film transistor;

a second planarization film covering the second gate electrode of the top gate thin film transistor; and within the pixel in which the bottom gate type thin film transistor and the top gate type thin film transistor are disposed, a display device disposed on the second planarization film, connected to the bottom gate type thin film transistor.

* * * * *